(12) United States Patent
Kamada et al.

(10) Patent No.: US 10,340,172 B2
(45) Date of Patent: Jul. 2, 2019

(54) SEMICONDUCTOR WAFER SURFACE PROTECTION FILM AND METHOD FOR MANUFACTURING SEMICONDUCTOR DEVICE

(71) Applicant: MITSUI CHEMICALS TOHCELLO, INC., Chiyoda-ku, Tokyo (JP)

(72) Inventors: Jun Kamada, Narashino (JP); Noboru Kawasaki, Sakura (JP); Shinichi Usugi, Chiba (JP); Makoto Sukegawa, Tokyo (JP); Jin Kinoshita, Nagoya (JP); Kouji Igarashi, Tokai (JP); Akimitsu Morimoto, Nagoya (JP)

(73) Assignee: MITSUI CHEMICALS TOHCELLO, INC., Chiyoda-Ku (JP)

( * ) Notice: Subject to any disclaimer, the term of this patent is extended or adjusted under 35 U.S.C. 154(b) by 0 days.

(21) Appl. No.: 15/741,564

(22) PCT Filed: Jul. 1, 2016

(86) PCT No.: PCT/JP2016/003156
§ 371 (c)(1),
(2) Date: Jan. 3, 2018

(87) PCT Pub. No.: WO2017/006549
PCT Pub. Date: Jan. 12, 2017

(65) Prior Publication Data
US 2018/0197764 A1    Jul. 12, 2018

(30) Foreign Application Priority Data
Jul. 3, 2015   (JP) ................................. 2015-134596

(51) Int. Cl.
*C09J 7/30* (2018.01)
*B32B 27/00* (2006.01)
(Continued)

(52) U.S. Cl.
CPC .......... *H01L 21/6836* (2013.01); *B32B 27/00* (2013.01); *B32B 27/30* (2013.01);
(Continued)

(58) Field of Classification Search
CPC .................... H01L 21/68757; C09J 133/12
See application file for complete search history.

(56) References Cited

U.S. PATENT DOCUMENTS

| | | | |
|---|---|---|---|
| 2003/0064579 A1* | 4/2003 | Miyakawa ................. | C09J 7/29 438/628 |
| 2007/0003758 A1* | 1/2007 | Jin ............................ | C09J 7/20 428/343 |
| 2010/0028588 A1 | 2/2010 | Kiuchi | |

FOREIGN PATENT DOCUMENTS

| | | |
|---|---|---|
| JP | 2003-173994 A | 6/2003 |
| JP | 2004-210890 A | 7/2004 |

(Continued)

OTHER PUBLICATIONS

International Search Report (PCT/ISA/210) dated Sep. 20, 2016, by the Japanese Patent Office as the International Searching Authority for International Application No. PCT/JP2016/003156.
(Continued)

*Primary Examiner* — Farun Lu
(74) *Attorney, Agent, or Firm* — Buchanan, Ingersoll & Rooney PC

(57) ABSTRACT

This semiconductor wafer surface protection film has a substrate layer A, an adhesive absorption layer B, and adhesive surface layer C, in the stated order. The adhesive absorption layer B comprises an adhesive composition containing a thermoset resin b1, said adhesive absorption layer B having a minimum value G'bmin of the storage elastic modulus G'b in the range of 25° C. to less than 250° C. of 0.001 MPa to less than 0.1 MPa, a storage elastic modulus G'b250 at 250° C. of 0.005 MPa or above, and a temperature
(Continued)

at which G'bmin is exhibited of 50-150° C. The adhesive surface layer C has a minimum value G'cmin of the storage elastic modulus G'c in the range of 25° C. to less than 250° C. of 0.03 MPa.

19 Claims, 1 Drawing Sheet

(51) Int. Cl.
| | |
|---|---|
| *B32B 27/30* | (2006.01) |
| *H01L 21/67* | (2006.01) |
| *C09J 133/06* | (2006.01) |
| *C09J 133/10* | (2006.01) |
| *C09J 133/12* | (2006.01) |
| *C09J 201/02* | (2006.01) |
| *H01L 21/283* | (2006.01) |
| *H01L 21/304* | (2006.01) |
| *H01L 21/683* | (2006.01) |
| *H01L 21/687* | (2006.01) |

(52) U.S. Cl.
CPC ............ *C09J 7/30* (2018.01); *C09J 133/068* (2013.01); *C09J 133/10* (2013.01); *C09J 201/02* (2013.01); *H01L 21/283* (2013.01); *H01L 21/304* (2013.01); *H01L 21/683* (2013.01); *C09J 133/12* (2013.01); *C09J 2201/36* (2013.01); *C09J 2201/622* (2013.01); *C09J 2203/326* (2013.01); *C09J 2433/00* (2013.01); *C09J 2463/00* (2013.01); *H01L 21/67132* (2013.01); *H01L 21/68757* (2013.01); *H01L 2221/6834* (2013.01); *H01L 2221/68327* (2013.01); *H01L 2221/68386* (2013.01)

(56) References Cited

FOREIGN PATENT DOCUMENTS

| | | |
|---|---|---|
| JP | 2008-115273 A | 5/2008 |
| JP | 2009-141023 A | 6/2009 |
| JP | 4367769 B2 | 11/2009 |
| JP | 4369584 B2 | 11/2009 |
| JP | 2011-195598 A | 10/2011 |

OTHER PUBLICATIONS

Written Opinion (PCT/ISA/237) dated Sep. 20, 2016, by the Japanese Patent Office as the International Searching Authority for International Application No. PCT/JP2016/003156.

* cited by examiner

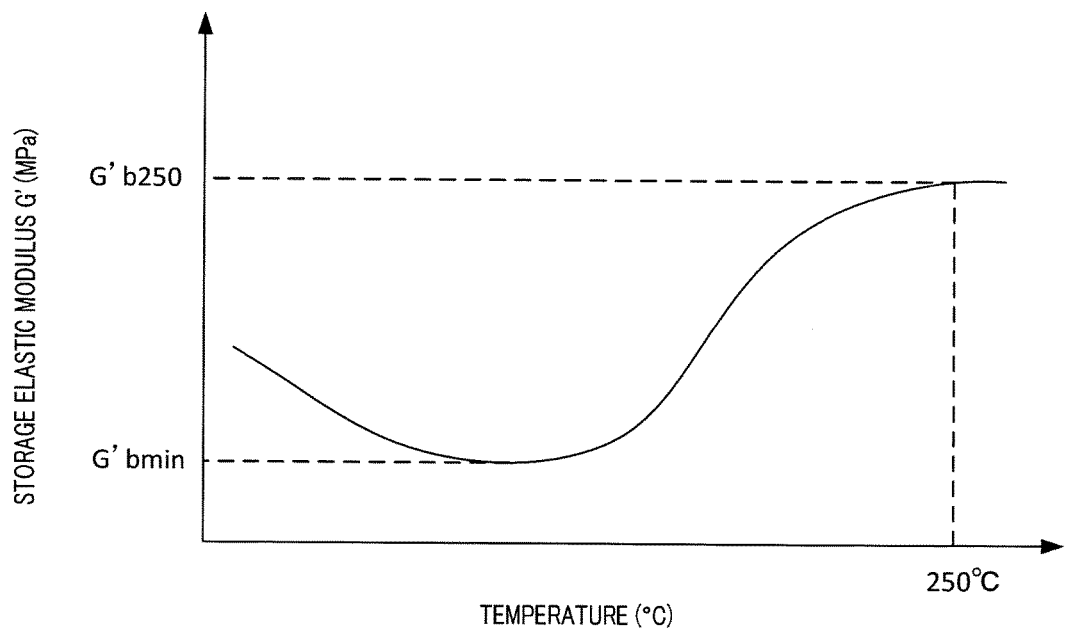

SEMICONDUCTOR WAFER SURFACE PROTECTION FILM AND METHOD FOR MANUFACTURING SEMICONDUCTOR DEVICE

TECHNICAL FIELD

The present invention relates to a semiconductor wafer surface protection film and a method for producing a semiconductor apparatus.

BACKGROUND ART

Semiconductor apparatuses are typically produced through thinning of a semiconductor wafer by grinding the non-circuit forming surface of the semiconductor wafer (back grinding process), formation of electrodes on the non-circuit forming surface of the semiconductor wafer after grinding by sputtering or the like (back metal process), and so on. These processes are performed with a surface protection film affixed to the circuit forming surface of a semiconductor wafer to prevent stains caused by grinding debris or grinding water on the circuit forming surface of the semiconductor wafer.

The surface protection film to be used in such a situation is required to be capable of conforming satisfactorily with irregularities in the circuit forming surface of a semiconductor wafer and being peelable without leaving any adhesive residue in peeling.

Proposed as such a surface protection film are, for example, a surface protection film including a substrate layer, an intermediate layer, and an adhesive layer in the order presented, wherein the intermediate layer contains an acrylic polymer and an isocyanate crosslinking agent, and the adhesive layer contains an acrylic polymer having a carbon-carbon double bond, an isocyanate crosslinking agent, and a photopolymerization initiator (PTL 1); and a surface protection film including a substrate layer, an intermediate layer, and an adhesive layer in the order presented, wherein the intermediate layer contains an acrylic polymer, an isocyanate-based crosslinking agent, an ultraviolet-curable oligomer, and a photopolymerization initiator, and the adhesive layer contains an acrylic polymer having a carbon-carbon double bond, an isocyanate-based crosslinking agent, and a photopolymerization initiator (PTL 2). These surface protection films allow easy peeling through curing of the ultraviolet-curable oligomer contained in the adhesive layer or the intermediate layer by ultraviolet irradiation in peeling.

CITATION LIST

Patent Literature

PTL 1
  Japanese Patent No. 4369584
PTL 2
  Japanese Patent No. 4367769

SUMMARY OF INVENTION

Technical Problem

In the back grinding process and back metal process, a semiconductor wafer is likely to be heated to high temperature. In the back metal process, in particular, a thin film of metal such as copper and aluminum is deposited on the non-circuit forming surface of a semiconductor wafer after grinding, and hence the semiconductor wafer is placed under vacuum and likely to be heated to a high temperature around 250° C. If the elastic modulus of the intermediate layer or adhesive layer of the surface protection film is excessively low after such a reduced-pressure/high-temperature process, the adhesion force of the film is excessively high, and the excessive high adhesion force disadvantageously causes frequent cracks or adhesive residues in the wafer in peeling.

If the elastic modulus of the intermediate layer or adhesive layer of the surface protection film is excessively high, on the other hand, the surface protection film does not conform with the irregularities in the wafer, and bubbles are likely to intrude between the irregularities in the wafer and the film. When such a wafer with bubbles having intruded between the wafer and the film is processed at high temperature, lifting of the film is likely to occur through the swelling of the bubbles, which may cause failure in formation of a metal thin film.

In the case of the surface protection film of PTL 1 or 2, a higher elastic modulus could be imparted to some degree to the adhesive layer or the intermediate layer through ultraviolet irradiation to cure it before a high-temperature process such as the back metal process. However, enhancement of the transparency of the substrate layer to improve the transmittance for ultraviolet light is necessary for irradiation with ultraviolet rays enough to cure the adhesive layer or the intermediate layer. There are few substrate layers having sufficient thermal resistance and high transparency, and the thermal resistance of a substrate layer is insufficient in most cases.

The present invention was made in view of the above-mentioned circumstances, and an object of the present invention is to provide a semiconductor wafer surface protection film which can be affixed to the circuit forming surface of a semiconductor wafer to conform satisfactorily with irregularities in the circuit forming surface of the semiconductor wafer and prevent cracks or adhesive residues in the wafer in peeling even after a high-temperature process such as the back metal process.

Solution to Problem

[1] A semiconductor wafer surface protection film including a substrate layer A, an adhesive absorption layer B, and an adhesive surface layer C in the order presented, in which the adhesive absorption layer B includes an adhesive composition including a thermoset resin b1. the minimum value, G'bmin, of the storage elastic modulus, G'b, in the range of 25° C. or higher and lower than 250° C. of the adhesive absorption layer B is 0.001 MPa or higher and lower than 0.1 MPa, the storage elastic modulus at 250° C., G'b250. of the adhesive absorption layer B is 0.005 MPa or higher, and the temperature at which the G'bmin is exhibited is 50° C. or higher and 150° C. or lower, and the minimum value, G'cmin, of the storage elastic modulus, G'c, in the range of 25° C. or higher and lower than 250° C. of the adhesive surface layer C is 0.03 MPa or higher.

[2] The semiconductor wafer surface protection film according to [1]. in which the
  G'cmin is higher than the G'bmin.

[3] The semiconductor wafer surface protection film according to [1] or [2]. in which the G'b250 is higher than the G'bmin.

[4] The semiconductor wafer surface protection film according to any of [1] to [3]. in which the G'cmin is 0.03 MPa or higher and lower than 3 MPa, and the storage elastic modulus at 250° C., G'c250. of the adhesive surface layer C is 0.1 MPa or higher.

[5] The semiconductor wafer surface protection film according to any of [1] to [4]. in which the thickness of the adhesive absorption layer B, Tb, is 10 μm or larger and 600 μm or smaller, and the thickness of the adhesive surface layer C, Tc, is 1 μm or larger and 50 μm or smaller.

[6] The semiconductor wafer surface protection film according to any of [1] to [5]. in which the thermoset resin b1 is a thermoset resin having a thermopolymerizable double bond, an epoxy group, or an aziridinyl group.

[7] The semiconductor wafer surface protection film according to any of [1] to [6]. in which the thermoset resin b1 is a (meth)acrylate-based polymer having a thermopolymerizable double bond, an epoxy group, or an aziridinyl group.

[8] The semiconductor wafer surface protection film according to any of [1] to [7]. in which the thermoset resin b1 is a (meth)acrylate-based polymer having a thermopolymerizable double bond.

[9] The semiconductor wafer surface protection film according to [7]. in which constitutional units each modified with a compound having the thermopolymerizable double bond, the epoxy group, or the aziridinyl group account for 0.2 to 30 mol % of all constitutional units of the (meth)acrylate-based polymer.

[10] The semiconductor wafer surface protection film according to [9]. in which the adhesive composition further includes a thermal polymerization initiator.

[11] The semiconductor wafer surface protection film according to any of [1] to [10]. in which the adhesive composition further includes a thermoplastic resin b2. and the content ratio between the thermoset resin b1 and the thermoplastic resin b2 is 1/99 to 90/10 as b1/b2 in a mass ratio.

[12] The semiconductor wafer surface protection film according to [11]. in which the thermoplastic resin b2 is a (meth)acrylate-based polymer

[13] The semiconductor wafer surface protection film according to any of [1] to [12]. in which the adhesive composition further includes a crosslinking agent.

[14] The semiconductor wafer surface protection film according to any of [1] to [13]. in which the adhesive surface layer C includes a (meth)acrylate-based polymer.

[15] The semiconductor wafer surface protection film according to [14]. in which the (meth)acrylate-based polymer contained in the adhesive surface layer C has a thermopolymerizable double bond, an epoxy group, or an aziridinyl group.

[16] The semiconductor wafer surface protection film according to [15]. in which at least a part of the (meth)acrylate-based polymer having a thermopolymerizable double bond, an epoxy group, or an aziridinyl group contained in the adhesive surface layer C has been cured.

[17] A method for producing a semiconductor apparatus, the method including: affixing the semiconductor wafer surface protection film according to any of [1] to [16] to a circuit forming surface of a semiconductor wafer at a temperature lower than the temperature at which G'bmin is exhibited; grinding a non-circuit forming surface of the semiconductor wafer having the semiconductor wafer surface protection film affixed thereto; processing the non-circuit forming surface of the semiconductor wafer after grinding at a temperature equal to or higher than the temperature at which G'bmin is exhibited; and peeling off the semiconductor wafer surface protection film.

[18] The method for producing a semiconductor apparatus according to [17]. in which a step having a height of 0.1 μm or larger has been provided on the circuit forming surface of the semiconductor wafer.

[19] The method for producing a semiconductor apparatus according to [17] or [18]. in which the processing at a temperature equal to or higher than the temperature at which the G'bmin is exhibited includes: forming a thin film on the non-circuit forming surface of the semiconductor wafer by at least one selected from the group consisting of sputtering, vapor deposition, plating, and chemical vapor deposition; impurity-activating annealing; ion-injecting; or reflowing.

Advantageous Effects of Invention

The present invention can provide a semiconductor wafer surface protection film which can be affixed to the circuit forming surface of a semiconductor wafer to conform satisfactorily with irregularities in the circuit forming surface of the semiconductor wafer and prevent cracks or adhesive residues in the wafer in peeling even after a high-temperature process such as the back metal process.

BRIEF DESCRIPTION OF DRAWING

FIG. 1 schematically illustrates an example of temperature-storage elastic modulus profiles for adhesive absorption layer B of the semiconductor wafer surface protection film.

DESCRIPTION OF EMBODIMENTS

The present inventors focused on the idea that configuration of adhesive absorption layer B with "thermoset adhesive composition" can eliminate the need of light irradiation to cure adhesive absorption layer B. The present inventors further diligently examined, and found 1) that reduction in G'bmin of adhesive absorption layer B to lower than 0.1 MPa is primarily effective to enhance the conformability of a film to irregularities and prevent lifting of a film in a high-temperature process; and 2) that setting adhesive absorption layer B so that G'bmin is 0.001 MPa or higher, the temperature at which G'bmin is exhibited is in the range of 50° C. or higher and 150° C. or lower, and G'b250 is 0.005 MPa or higher, in combination with moderately raising G'cmin of adhesive surface layer C to 0.03 MPa or higher, is primarily effective to prevent cracks or adhesive residues in a wafer in peeling even after a high-temperature process such as the back metal process. The present invention was made on the basis of these findings.

1. Semiconductor Wafer Surface Protection Film

The semiconductor wafer surface protection film includes substrate layer A, adhesive absorption layer B, and adhesive surface layer C in the order presented.

Substrate Layer A

Substrate layer A is not limited in any manner, and configured with a thermoplastic resin, a thermoset resin, a metal foil, or a paper sheet, etc.

Examples of the thermoplastic resin include polyesters such as polyethylene terephthalate (PET) and polyethylene naphthalate (PEN); polyolefin-based resins; polyimides (PI); polyether ether ketones (PEEK); polyvinyl chloride-based resins such as polyvinyl chloride (PVC); polyvinylidene chloride-based resins; polyamide-based resins; polyurethanes; polystyrene-based resins; acrylic resins; fluororesins; cellulosic resins; and polycarbonate-based resins. Especially, preferred thermoplastic resins are thermoplastic resins having a melting point of 250° C. or higher (preferably of 265° C. or higher) or thermal-resistant resins being pyrolytic without any clear melting point, both having high heat resistance, and more preferred are polyimides and polyesters. The melting point of a thermoplastic resin can be measured, for example, by using a differential scanning calorimeter (e.g., model DSC220C, manufactured by Seiko Instruments Inc.) at a temperature elevation rate of 10° C./min.

The thickness of substrate layer A is preferably 10 to 300 μm, and more preferably 20 to 200 μm. Substrate layer A having such a thickness at a certain level or higher facilitates affixation of the semiconductor wafer surface protection film, and stable holding of a semiconductor wafer in grinding of the semiconductor wafer. Substrate layer A having such a thickness at a certain level or lower provides higher workability in peeling off the semiconductor wafer surface protection film.

Substrate layer A may be configured with one layer or a plurality of layers. In the case that substrate layer A is configured with a plurality of layers, the compositions of the layers may be identical or different.

As mentioned above, the semiconductor wafer surface protection film is affixed to the circuit forming surface of a semiconductor wafer. Hence, it is preferred for adhesive absorption layer B of the semiconductor wafer surface protection film to have a moderately low storage elastic modulus in order to allow the semiconductor wafer surface protection film to conform satisfactorily with irregularities in the circuit forming surface of a semiconductor wafer and closely attach thereto in a satisfactory manner.

A metal thin film is deposited on the non-circuit forming surface of a semiconductor wafer after grinding in the back metal process for a semiconductor wafer, and hence the semiconductor wafer is likely to be heated to a high temperature around 250° C. To prevent the break of a semiconductor wafer due to distortion of adhesive absorption layer B of the semiconductor wafer surface protection film and adhesive residues or the like in peeling off the semiconductor wafer surface protection film even at such a high temperature, it is preferred for adhesive absorption layer B of the semiconductor wafer surface protection film to have a moderately high storage elastic modulus in a high-temperature process such as the back metal process.

Thus, it is preferred for adhesive absorption layer B of the semiconductor wafer surface protection film to have a moderately low storage elastic modulus in being affixed (at normal temperature) and have a moderately high storage elastic modulus in high-temperature processing such as the back metal process. In view of this, it is preferred in the present invention to configure adhesive absorption layer B of the semiconductor wafer surface protection film with an adhesive composition containing a thermoset resin and a thermal polymerization initiator.

When heat is applied to the adhesive composition containing a thermoset resin and a thermal polymerization initiator in a high-temperature process, curing reaction of the thermoset resin proceeds. Thereby, adhesive absorption layer B of the semiconductor wafer surface protection film, which has a moderately low storage elastic modulus at room temperature, can become a layer having a moderately high storage elastic modulus through a high-temperature process.

Although a wafer including the semiconductor wafer surface protection film affixed thereto may be introduced from an environment at room temperature directly into a high-temperature process, lifting due to foaming caused by water vapor from the semiconductor wafer surface protection film or the wafer occurs in some cases. To prevent such failure, it is preferred to dry the semiconductor wafer surface protection film in a drying process at a moderate temperature and progress the partial curing of adhesive absorption layer B after affixation of the semiconductor wafer surface protection film to a wafer and before introduction into a high-temperature process (heating process). The conditions in the drying process depend on the thermoset resin to be used and the configuration of the semiconductor wafer surface protection film, and the drying process can be performed at a temperature of 60 to 180° C. for a period of about 1 second to 30 minutes in typical cases.

Adhesive Absorption Layer B

Adhesive absorption layer B can be configured with an adhesive composition containing thermoset resin b1. The adhesive composition may further contain at least one of a thermal polymerization initiator and a crosslinking agent.

(Thermoset Resin b1)

Thermoset resin b1 is a polymer having a thermopolymerizable double bond, an epoxy group, or an aziridinyl group, and is preferably a (meth)acrylate-based polymer having a thermopolymerizable double bond, an epoxy group, or an aziridinyl group, and more preferably a (meth)acrylate-based polymer having a thermopolymerizable double bond, because, for example, the storage elastic modulus can be easily adjusted. It should be noted that the term "(meth)acrylate-based polymer" in the present invention refers to methacrylate-based polymer or acrylate-based polymer. A part or the entire of the (meth)acrylate-based polymer may be a polyfunctional (meth)acrylate compound.

The (meth)acrylate-based polymer having a thermopolymerizable double bond, an epoxy group, or an aziridinyl group is obtained through copolymerization of an alkyl (meth)acrylate monomer and a monomer being copolymerizable therewith and having a functional group, followed by modification of the functional group of the resulting copolymer with a compound having a thermopolymerizable double bond, an epoxy group, or an aziridinyl group.

In general, methacrylate-based polymer is more likely to undergo depolymerization at low temperature than the corresponding acrylate-based polymer, and tends to be inferior in thermal resistance to the corresponding acrylate-based polymer. Accordingly, it is preferred for the alkyl (meth)acrylate monomer for obtaining the (meth)acrylate-based polymer to contain 50 mass % or more of an alkyl acrylate monomer, from the viewpoint of enhancement of the thermal resistance of adhesive absorption layer B containing the (meth)acrylate-based polymer. Examples of the alkyl acrylate monomer include methyl acrylate, ethyl acrylate, propyl acrylate, butyl acrylate, and 2-ethylhexyl acrylate. One of the alkyl (meth)acrylate monomers may be used singly, or two or more thereof may be used in combination.

In the monomer being copolymerizable with the alkyl (meth)acrylate monomer and having a functional group, the functional group is a functional group for introduction of a thermopolymerizable double bond, an epoxy group, or an aziridinyl group, and examples of the functional group include a glycidyl group, a carboxy group, a hydroxy group, and an isocyanate group.

Examples of the monomer being copolymerizable with the alkyl (meth)acrylate monomer and having a functional group include glycidyl group-containing monomers such as glycidyl (meth)acrylate and methylglycidyl (meth)acrylate; carboxy group-containing monomers such as (meth)acrylic acid, itaconic acid, maleic anhydride, crotonic acid, maleic acid, and fumaric acid; hydroxy group-containing monomers such as 2-hydroxyethyl (meth)acrylate; and isocyanate group-containing monomers such as 2-methacryloyloxyethyl isocyanate. Among them, the glycidyl group-containing monomers and carboxy group-containing monomers are preferred, for example, because a hydroxy group to serve as a crosslinking point can be formed in the course of introduction of a thermopolymerizable double bond, an epoxy group, or an aziridinyl group. One of monomers having a functional group may be used singly, or two or more thereof may be used in combination.

Examples of compounds having a thermopolymerizable double bond include unsaturated carboxylic acids such as (meth)acrylic acid. Examples of compounds having an epoxy group include polyfunctional epoxy compounds such as tris(2,3-epoxypropyl) isocyanurate, tris(3,4-epoxybutyl) isocyanurate, tris(4,5-epoxypentyl)isocyanurate, tris(5,6-epoxyhexyl) isocyanurate, and tris(glycidyloxyethyl) isocyanurate. Examples of compounds having an aziridinyl group include polyfunctional aziridine compounds such as 2,2-bis(hydroxymethyl)butanol tris[3-(1-aziridinyl)propionate] and 4,4-bis(ethyleneiminocarbonylamino)diphenylmethane.

For example, a thermopolymerizable double bond can be introduced into a copolymer including a unit derived from a glycidyl group-containing monomer by reacting the copolymer and (meth)acrylic acid, which has a carboxy group being capable of addition-polymerizing with a glycidyl group, as a compound having a thermopolymerizable double bond. A thermopolymerizable double bond can be introduced into a copolymer including a unit derived from a carboxy group-containing monomer by reacting the copolymer and glycidyl (meth)acrylate, which has a glycidyl group being capable of addition-polymerizing with a carboxy group, as a compound having a thermopolymerizable double bond.

An additional monomer may be further contained for the monomer to be copolymerized with the alkyl (meth)acrylate monomer, as necessary, in addition to the above-described monomer having a functional group. Examples of the additional monomer include vinyl acetate, styrene, (meth)acrylonitrile, N-vinylpyrrolidone, (meth)acryloylmorpholine, cyclohexylmaleimide, isopropylmaleimide, and (meth)acrylamide.

The content ratio of constitutional units derived from the monomer having a functional group in the (meth)acrylate-based polymer having a thermopolymerizable double bond, an epoxy group, or an aziridinyl group is preferably 0.2 to 30 mol %, and more preferably 1 to 20 mol %, with respect to the total constitutional units in the (meth)acrylate-based polymer. In other words, it is preferred that 0.2 to 30 mol %, preferably 1 to 20 mol %, of the total constitutional units in the (meth)acrylate-based polymer have been modified with the compound having a thermopolymerizable double bond, an epoxy group, or an aziridinyl group. Here, the term "constitutional units" refers to backbones derived from a polymerizable monomer in a polymer, and the term "total constitutional units" refers to the total number of backbones derived from a polymerizable monomer in a polymer. In the case that a polymer is produced by copolymerizing 90 molecules of the alkyl (meth)acrylate monomer and 10 molecules of the monomer having a functional group, for example, the content ratio of constitutional units derived from the monomer having a functional group is 10mol % with respect to the total constitutional units of the resulting polymer. With such a content ratio of constitutional units derived from the monomer having a functional group in the (meth)acrylate-based polymer having a thermopolymerizable double bond, an epoxy group, or an aziridinyl group at a certain level or higher, the thermal resistance of adhesive absorption layer B is enhanced and the semiconductor wafer surface protection film after a high-temperature process can exert peelability.

The weight-average molecular weight, Mw, of the (meth)acrylate-based polymer having a thermopolymerizable double bond, an epoxy group, or an aziridinyl group is preferably 50,000 to 1,000,000. and more preferably 100,000 to 1,000,000. Such a weight-average molecular weight, Mw, at a certain level or higher facilitates retention of the sheet shape of adhesive absorption layer B even at normal temperature. Such a weight-average molecular weight, Mw, at a certain level or lower provides adhesive absorption layer B with a storage elastic modulus being not excessively high, and hence the conformability to irregularities is less likely to be deteriorated.

The (meth)acrylate-based polymer having a thermopolymerizable double bond, an epoxy group, or an aziridinyl group may have been crosslinked with a crosslinking agent for easy adjustment of the adhesion force and storage elastic modulus of the adhesive composition at normal temperature.

Examples of the crosslinking agent include epoxy-based crosslinking agents such as pentaerythritol polyglycidyl ether and diglycerol polyglycidyl ether; isocyanate-based crosslinking agents such as tetramethylene diisocyanate, hexamethylene diisocyanate, and polyisocyanate; and melamine-based crosslinking agents.

The content of the (meth)acrylate-based polymer having a thermopolymerizable double bond, an epoxy group, or an aziridinyl group can be 70 mass % or more, preferably 80 mass % or more, and more preferably 90 mass % or more, with respect to the adhesive composition.

(Thermal Polymerization Initiator)

The adhesive composition constituting adhesive absorption layer B contains a thermal polymerization initiator. In the case that thermoset resin b1 has a thermopolymerizable double bond, the thermal polymerization initiator is preferably a thermal radical polymerization initiator. In the case that thermoset resin b1 has an epoxy group or an aziridinyl group, the thermal polymerization initiator is preferably a thermal cationic polymerization initiator or a thermal anionic polymerization initiator, and it is more preferred for the thermal polymerization initiator to have potential curability.

Examples of the thermal radical polymerization initiator include azo-based compounds, AIBN, and organic peroxides, and the thermal radical polymerization initiator can be preferably an organic peroxide. The organic peroxide preferably has a 10-hour half-life temperature of about 70 to 150° C. for imparting storage stability to the organic peroxide and allowing the organic peroxide to decompose through a high-temperature process to be used.

Examples of the organic peroxide include the following compounds, but are not limited thereto.

Bis(4-methylbenzoyl) peroxide, t-butylperoxy-2-ethyl hexanoate, benzoyl peroxide, 1,1-bis(t-butylperoxy)-2-methylcyclohexane, 1,1-bis(t-hexylperoxy)cyclohexane, 1,1-bis(t-butylperoxy)cyclohexane, 2,2-bis(4,4-bis(t-butylperoxy)cyclohexyl)propane, t-hexylperoxyisopropyl monocarboxylate, t-butyl peroxymaleate, 2,2-bis(t-butylperoxy)butane, t-butyl peroxyacetate, n-butyl 4,4-bis(t-butylperoxy)pentanoate, bis(2-t-butylperoxyisopropyl)benzene, dicumyl peroxide, bis-t-hexyl peroxide, 2,5-dimethyl-2,5-bis(t-butylperoxy)hexane, t-butylcumyl peroxide, di-t-butyl peroxide, 2,5-dimethyl-2,5-bis(t-butylperoxy)hexyne, and diisopropylbenzene hydroperoxide.

Examples of the thermal cationic polymerization initiator include the following compounds, but are not limited thereto.

Phosphine compounds such as triphenylphosphine; and phosphonium salts such as tetraphenylphosphonium tetraphenylborate.

Examples of the thermal anionic polymerization initiator include the following compounds, but are not limited thereto.

Tertiary amines such as piperidine, N,N-dimethylpiperazine, triethylenediamine, diazabicycloundecene, diazabicyclononene, and tris(dimethylaminomethyl)phenol;

tertiary amine salts such as diazabicycloundecene octylate, diazabicycloundecene formate, diazabicycloundecene p-toluenesulfonate, and diazabicycloundecene o-phthalate; and imidazole compounds such as imidazole, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-undecylimidazolium trimellitate, 1-cyanoethyl-2-phenylimidazolium trimellitate, 2-phenyl-4,5-dihydroxymethylimidazole, and 2-phenyl-4-methyl-5-hydroxymethylimidazole.

The content of the thermal polymerization initiator is preferably 0.01 to 10 parts by mass, and more preferably 0.1 to 5 parts by mass, with respect to 100 parts by mass of thermoset resin b1 (preferably, a (meth)acrylate-based polymer having a thermopolymerizable double bond). Reduction of the adhesion force in storing the semiconductor surface protection film and stains on the surface of the wafer after peeling can be satisfactorily prevented by setting the content of the thermal polymerization initiator to 10 parts by mass or less. In addition, adhesive residues and cracks in the wafer in use caused by the increase of the adhesion force of the semiconductor surface protection film can be satisfactorily prevented by setting the content of the thermal polymerization initiator to 0.01 parts by mass or more.

(Crosslinking Agent)

The adhesive composition constituting adhesive absorption layer B may further contain a crosslinking agent. The crosslinking agent added to the adhesive composition elicits crosslinking reaction in adhesive absorption layer B in a usage environment, and excessive reduction of G'bmin is prevented.

Examples of the crosslinking agent include epoxy-based crosslinking agents such as pentaerythritol polyglycidyl ether and diglycerol polyglycidyl ether; isocyanate-based crosslinking agents such as tetramethylene diisocyanate, hexamethylene diisocyanate or an adduct thereof, polyhydrogenated xylylene diisocyanate or an adduct thereof, and polyisocyanate; and melamine-based crosslinking agents. Examples of commercially available products of the isocyanate-based crosslinking agent include OLESTER P49-75S, TAKENATE D-120N, TAKENATE D-160N, and TAKENATE D-170N (all manufactured by Mitsui Chemicals, Inc.).

The content of the crosslinking agent in the adhesive composition constituting adhesive absorption layer B is preferably 20 parts by mass or less, more preferably 0.1 to 20 parts by mass, and even more preferably 0.1 to 10 parts by mass, with respect to 100 parts by mass of (meth) acrylate-based polymer having a thermopolymerizable double bond to be crosslinked. Reduction of absorbability to irregularities in affixation of the semiconductor wafer surface protection film to a wafer can be satisfactorily prevented by setting the content of the crosslinking agent to 20 parts by mass or less.

The adhesive composition constituting adhesive absorption layer B may further contain an additional resin or additive in a manner such that the advantageous effects of the present invention are not impaired.

Examples of the additional resin include thermoplastic resin b2. Thermoplastic resin b2 is preferably a (meth) acrylate-based polymer. The (meth)acrylate-based polymer can be the same as the "(meth)acrylate-based polymer" before being modified with the above-described compound having a thermopolymerizable double bond, an epoxy group, or an aziridinyl group. The content ratio of thermoset resin b1 to thermoplastic resin b2 in adhesive absorption layer B can be b1/b2=1/99 to 90/10 as a mass ratio.

Examples of the additional additive include tackifiers, plasticizers, softeners, fillers, and antioxidants. For example, the adhesive composition constituting adhesive absorption layer B may contain a polymerization inhibitor to enhance the storage stability of the adhesive composition, or a pigment, a dye, or the like, as necessary, in a manner such that the properties of the adhesive composition are not impaired.

The storage elastic modulus, G'b, of adhesive absorption layer B measured in the range of 25° C. or higher and lower than 250° C. preferably reaches the minimum value, G'bmin, at a temperature in the range of 50° C. or higher and 150° C. or lower, and more preferably reaches the minimum value, G'bmin, at a temperature in the range of 75° C. or higher and 125° C. or lower. Satisfactory storage stability is provided (a low elastic modulus can be maintained even after a certain period), and hence stable affixability (conformability) is readily achieved by virtue of the temperature at which G'bmin is exhibited being 50° C. or higher. Simultaneously, excessive increase of the adhesion force or adhesive residues in peeling can be prevented by virtue of the temperature at which G'bmin is exhibited being 150° C. or lower.

G'bmin of adhesive absorption layer B is preferably 0.001 MPa or higher and lower than 0.1 MPa, and more preferably 0.005 MPa or higher. Such G'bmin of adhesive absorption layer B being at a certain level or higher facilitates retention of the shape of adhesive absorption layer B. Such G'bmin of adhesive absorption layer B being at a certain level or lower allows adhesive absorption layer B to conform satisfactorily with irregularities in the circuit forming surface of a wafer and absorb a stress. Thereby, lifting of the film caused by swelling of bubbles having intruded between the irregularities and the film at high temperature can be prevented. G'bmin of adhesive absorption layer B and the temperature at which G'bmin is exhibited can be adjusted, for example, through the quantity and type of the crosslinking agent in the adhesive composition.

G'b250 of adhesive absorption layer B is preferably 0.005 MPa or higher, and more preferably 0.01 MPa or higher. The upper limit of G'b250 can be about 10 MPa. The adhesion force of the film in peeling can be reduced and cracks in a wafer can be prevented with G'b250 of 0.005 MPa or higher. The conformability to irregularities is less likely to be deteriorated with G'b250 of 10 MPa or lower. G'b250 of adhesive absorption layer B can be adjusted, for example, through the content ratio of thermoset resin b1. the content ratio of the group having a thermopolymerizable double bond contained in thermoset resin b1. the type of the thermal polymerization initiator, and the content of the crosslinking agent.

It is preferred that G'b250 be higher than G'bmin. This is because satisfactory conformability to irregularities in a wafer can be achieved, and the adhesion force of the film in peeling can be sufficiently reduced.

G'bmin and the storage elastic modulus at 250° C., G'b250. of adhesive absorption layer B preferably satisfy the following equation.

$$G'b250/G'b \text{ min} \leq 1.5 \qquad \text{(Equation (1))}$$

Such G'b250/G'bmin at a certain level or higher provides adhesive absorption layer B with higher conformability to irregularities in affixation, and adhesive residues derived from adhesive absorption layer B or cracks in a wafer in high-temperature processing can be prevented.

To control G'b250/G'bmin to the above-described value at a certain level or higher, it is preferred to configure adhesive absorption layer B with the above-described adhesive composition containing thermoset resin b1 and the thermal polymerization initiator. G'b250/G'bmin can be adjusted, for example, through the content ratio of thermoset resin b1. the content ratio of the group having a thermopolymerizable double bond contained in thermoset resin b1, the type of the thermal polymerization initiator, and the content of the crosslinking agent.

The storage elastic modulus of adhesive absorption layer B at 25° C., G'b25. is preferably 0.001 MPa or higher and lower than 0.7 MPa, and more preferably 0.01 MPa or higher and 0.5 MPa or lower. Lowering of the workability caused by the protrusion of adhesive absorption layer B from the film and lowering of the cut-out properties can be satisfactorily prevented with G'b25 of adhesive absorption layer B being 0.001 MPa or higher. Simultaneously, adhesive absorption layer B conforms satisfactorily with irregularities in the circuit forming surface of a wafer and sufficiently absorb a stress with G'b25 of lower than 0.7 MPa, and thus lifting of the film can be satisfactorily prevented. G'b25 of adhesive absorption layer B can be adjusted, for example, through the quantity of the crosslinking agent in the adhesive composition.

It is preferred that the thickness of adhesive absorption layer B, Tb, be larger than the thickness of adhesive surface layer C, Tc.

Such a thickness of adhesive absorption layer B, Tb, at a certain level or higher facilitates achievement of sufficient conformability to irregularities in the circuit forming surface of a semiconductor wafer. Simultaneously, a thickness of adhesive absorption layer B, Tb, at a certain level or lower enables prevention of the protrusion of adhesive absorption layer B and the break of a wafer after grinding due to a bending stress applied to the semiconductor wafer surface protection film in peeling it.

The thickness of adhesive absorption layer B, Tb, can be in the range of 10 to 600 μm, preferably in the range of 20 to 300 μm, although depending on the height of irregularities in the surface of a wafer.

Adhesive Surface Layer C

Adhesive surface layer C can be configured with a known adhesive composition, for example, an adhesive composition containing (meth)acrylate-based polymer. Examples of the (meth)acrylate-based polymer include (meth)acrylate-based polymer described in Japanese Patent Application Laid-Open No. 2004-210890.

The (meth)acrylate-based polymer contained in the adhesive composition constituting adhesive surface layer C may be the (meth)acrylate-based polymer having a thermopolymerizable double bond, an epoxy group, or an aziridinyl group contained in adhesive absorption layer B. In this case, a part or the entire of the (meth)acrylate-based polymer having a thermopolymerizable double bond, an epoxy group, or an aziridinyl group can be cured in advance (with a crosslinking agent) to achieve the above preferred storage elastic modulus.

In the case that the (meth)acrylate-based polymer contained in the adhesive composition constituting adhesive surface layer C has not been cured, the adhesive composition may further contain a crosslinking agent in addition to the (meth)acrylate-based polymer. The adhesive composition constituting adhesive surface layer C may be identical to or different from the adhesive composition constituting adhesive absorption layer B.

The minimum value, G'cmin, of the storage elastic modulus of adhesive surface layer C measured in the range of 25° C. or higher and lower than 250° C. is preferably 0.03 MPa or higher and lower than 3 MPa, and more preferably 0.05 MPa or higher and lower than 2 MPa. Adhesive residues on the surface of wafer caused by peeling failure of adhesive surface layer C after a high-temperature process can be prevented with G'cmin of 0.03 MPa or higher. Simultaneously, lifting of the film due to reduction of the adhesion force of adhesive surface layer C in a high-temperature process can be satisfactorily prevented with G'cmin of lower than 3 MPa.

The storage elastic modulus at 250° C., G'c250. is preferably 0.1 MPa or higher. Adhesive residues caused by peeling failure of adhesive surface layer C after a high-temperature process can be prevented with G'c250 of 0.1 MPa or higher. The upper limit of G'c250 can be about 100 MPa. G'cmin and G'c250 can be adjusted, for example, through the type and content of the polymerization initiator contained in adhesive surface layer C.

It is preferred that G'cmin of adhesive surface layer C be higher than G'bmin of adhesive absorption layer B, in a manner such that the adhesion is not excessively deteriorated. This is because adhesive residues derived from adhesive surface layer C in peeling off the semiconductor wafer surface protection film is prevented and thereby peeling at a low load can be achieved, and the conformability of adhesive absorption layer B to irregularities and stress absorption properties of adhesive absorption layer B are maintained. In the case that adhesive surface layer C contains a (meth)acrylate-based polymer cured in advance, the phrase "G'cmin of adhesive surface layer C" refers to G'cmin of adhesive surface layer C containing the (meth)acrylate-based polymer cured in advance.

The thickness of adhesive surface layer C can be set in a manner such that the holding and protection for a wafer are not impaired, and is preferably about 1 to 50 μm, and more preferably about 2 to 40 μm. Such a thickness of adhesive surface layer C at a certain level or higher results in improved productivity, and adhesive residues, which is caused by cleavage of adhesive surface layer C to expose adhesive absorption layer B in the surface in affixation, can be prevented. Simultaneously, such a thickness of adhesive surface layer C at a certain level or lower can provide higher conformability to irregularities in the surface of a semiconductor wafer in affixation of the semiconductor wafer surface protection film.

The semiconductor wafer surface protection film according to the present invention can be produced by using any method. For example, the semiconductor wafer surface protection film according to the present invention can be obtained by laminating an adhesive composition layer for adhesive absorption layer B and an adhesive composition layer for adhesive surface layer C above substrate layer A.

Lamination may be performed 1) in a manner such that an adhesive composition layer for adhesive absorption layer B and an adhesive composition layer for adhesive surface layer C are formed above substrate layer A by direct application; or 2) in a manner such that an adhesive composition layer for adhesive absorption layer B and an adhesive composition layer for adhesive surface layer C are formed above a sheet subjected to peeling treatment in advance by application and then these layers are transferred onto substrate layer A; or 3) by using combination of the methods of 1) and 2).

Application of the composition for each layer can be performed by using a coating method of, for example, die-coater coating, roll coating, screen coating, or gravure coating.

Specifically, the semiconductor wafer surface protection film according to the present invention can be obtained through 1) applying a coating solution containing a composition for adhesive absorption layer B onto substrate layer A and drying it to form adhesive absorption layer B; 2) applying a coating solution containing a composition for adhesive surface layer C onto a sheet subjected to peeling treatment in advance and drying it to form adhesive surface layer C; and 3) transferring adhesive surface layer C obtained in 2) onto adhesive absorption layer B in 1).

Curing reaction may be performed, as necessary, in step 1) or 2) for the purpose of controlling the storage elastic modulus of adhesive absorption layer B or adhesive surface layer C. The curing reaction can be performed by the action of the curable functional group of the resin composition and crosslinking agent contained in the adhesive composition. Any curing method suitable for the resin composition to be used can be employed as the curing method, without any limitation, and curing can be performed, for example, through radiation curing or thermal curing.

2. Method for Producing Semiconductor Apparatus

The semiconductor apparatus according to the present invention can be produced through 1) affixing the semiconductor wafer surface protection film according to the present invention to a circuit forming surface of a semiconductor wafer at a temperature lower than the temperature at which G'bmin is exhibited; 2) grinding a non-circuit forming surface of the semiconductor wafer including the semiconductor wafer surface protection film affixed thereto; 3) processing the non-circuit forming surface of the semiconductor wafer after grinding at a temperature equal to or higher than the temperature at which G'bmin is exhibited; and 4) peeling off the semiconductor wafer surface protection film.

In step 1), the semiconductor wafer surface protection film according to the present invention is affixed to a circuit forming surface of a semiconductor wafer at a temperature lower than the temperature at which G'bmin is exhibited. The "temperature lower than the temperature at which G'bmin is exhibited" is preferably 20 to 120° C., and more preferably 20 to 80° C.

The semiconductor wafer surface protection film according to the present invention is stacked on the semiconductor wafer in a manner such that adhesive surface layer C comes into contact with the semiconductor wafer, and they are then pressed to affix to each other by using a means for pressing such as a pressure roll. The affixation may be performed, for example, in a pressurizable container such as an autoclave, or in a vacuum chamber.

The step on the circuit forming surface of the semiconductor wafer can have a height of 0.1 µm or larger.

In step 2), the non-circuit forming surface of the semiconductor wafer is ground to a given thickness. Grinding of the non-circuit forming surface of the semiconductor wafer can be performed, for example, until the thickness of the wafer reaches about 60 µm.

Step 3) can include forming a thin film of metal such as copper and aluminum on the non-circuit forming surface of the semiconductor wafer after grinding (back metal process). Formation of a metal thin film is performed, for example, by using sputtering, vapor deposition, plating, or chemical vapor deposition (CVD). Then, the temperature of the semiconductor wafer is likely to reach a temperature equal to or higher than the temperature at which G'bmin is exhibited, for example, a high temperature of 100 to 350° C., preferably of 120 to 350° C.

In step 4), the semiconductor wafer surface protection film is peeled off from the circuit forming surface of the semiconductor wafer. The temperature in peeling can be, for example, 20 to 100° C.

FIG. 1 schematically illustrates an example of temperature-storage elastic modulus profiles for adhesive absorption layer B of the semiconductor wafer surface protection film according to the present invention. As illustrated in FIG. 1, as the temperature is gradually elevated, the storage elastic modulus, of adhesive absorption layer B temporarily decreases (see G'bmin), and the storage elastic modulus, G', then increases (see G'b250) through heating in the high-temperature process.

Since G'bmin of adhesive absorption layer B of the semiconductor wafer surface protection film according to the present invention has been adjusted to a moderately low value, the semiconductor wafer surface protection film can be affixed to conform satisfactorily with irregularities in the circuit forming surface of the semiconductor wafer in step 1). Thereby, stains on the circuit forming surface of the semiconductor wafer caused by grinding water or the like can be prevented in step 2). In addition, bubbles are less likely to intrude between the irregularities in the wafer and the film, and hence lifting of the film caused by swelling of bubbles can be prevented even when the semiconductor wafer surface protection film is exposed to a high temperature in step 4).

Since the semiconductor wafer surface protection film is heated to a high temperature in step 3), the (meth)acrylate-based polymer having a thermopolymerizable double bond, an epoxy group, or an aziridinyl group contained in adhesive absorption layer B undergoes thermal polymerization reaction to increase the storage elastic modulus of adhesive absorption layer B. In addition, the storage elastic modulus of adhesive surface layer C has been adjusted to a moderately high value. For these reasons, the adhesion force in peeling off the semiconductor wafer surface protection film from the circuit forming surface of the semiconductor wafer can be reduced in step 4), and peeling can be achieved with cracks in the wafer prevented and without leaving an adhesive residue.

Further, ultraviolet irradiation or the like is not required because the storage elastic modulus of adhesive absorption layer B can be enhanced through heat in the high-temperature process. For this reason, it is not required to consider the transparency and/or ultraviolet transmission of substrate layer A, and a resin film having high thermal resistance can be arbitrarily selected for use as substrate layer A.

The process for producing the semiconductor apparatus may further include, for example, ion-injecting, die-bonding, wire-bonding, flip-chip connecting, testing for heating for curing, impurity-activating annealing, resin sealing, or reflowing, as necessary.

EXAMPLES

Hereinafter, the present invention will be described in more detail with reference to Examples. These Examples are not intended for allowing limited interpretation of the scope of the present invention.

1. Materials of Film
   1) Substrate Layer A

Polyimide film: Kapton 150EN-A manufactured by DU PONT-TORAY CO., LTD., thickness: 38 µm (thermal-resistant resin film being pyrolytic without any clear melting point)

Polyethylene naphthalate film: Teonex manufactured by Teijin DuPont Films Japan Limited, thickness: 50 µm, melting point: 269° C.

2) Adhesive Absorption Layer B or Adhesive Surface Layer C (Preparation of Adhesive Coating Solution 1)

Synthesis of (meth)acrylate-based Polymer P1 having Thermopolymerizable Double Bond Mixed were 48 parts by mass of ethyl acrylate, 27 parts by mass of 2-ethylhexyl acrylate, 20 parts by mass of methyl acrylate, 5 parts by mass of glycidyl methacrylate, and 0.2 parts by mass of benzoyl peroxide as a polymerization initiator. The resulting solution was added dropwise into a nitrogen-purged flask containing 65 parts by mass of toluene and 50 parts by mass of ethyl acetate with stirring at 80° C. over 5 hours, and further reacted with stirring for 5 hours. After the completion of the reaction, the resulting solution was cooled, and 25 parts by mass of xylene, 2.5 parts by mass of acrylic acid, and 1.5 parts by mass of tetradecylbenzylammonium chloride were added thereto, and the resultant was reacted at 80° C. for 10 hours while air was blown therethrough, and thus a solution of acrylate-based polymer P1 having a thermopolymerizable double bond was obtained. The content ratio of constitutional units derived from glycidyl methacrylate with respect to the total constitutional units constituting polymer P1 was 3.926 mol %.

The weight-average molecular weight (Mw) of acrylate-based polymer P1 having a thermopolymerizable double bond obtained was measured by using a GPC (Shodex System-21H manufactured by Showa Denko K.K.) to be Mw=513,000.

To the solution of acrylate-based polymer P1 obtained, 0.8 parts by mass of PERTETRA A (2,2-bis(4,4-bis(t-butylperoxy)cyclohexyl)propane) manufactured by NOF CORPORATION as an organic peroxide with respect to 100 parts by mass of the polymer in terms of the solid content and 0.5 parts by mass of the isocyanate crosslinking agent OLESTER P49-75S (manufactured by Mitsui Chemicals, Inc.) with respect to 100 parts by mass of the polymer in terms of the solid content were added, and the resultant was diluted with a 1:1 ethyl acetate/toluene mixed solvent to afford adhesive coating solution 1 having a solid content concentration of 27 mass %.

(Preparation of Adhesive Coating Solution 2)

Adhesive coating solution 2 was obtained in the same manner as for adhesive coating solution 1 except that PERTETRA A (2,2-bis(4,4-bis(t-butylperoxy)cyclohexyl)propane, manufactured by NOF CORPORATION) was replaced with PERBUTYL O (t-butylperoxy-2-ethyl hexanoate, manufactured by NOF CORPORATION).

(Preparation of Adhesive Coating Solution 3)

Into a polymerization reactor, 150 parts by mass of deionized water, 0.625 parts by mass of 4,4'-azobis(4-cyanovaleric acid) (manufactured by Otsuka Chemical Co., Ltd., trade name: ACVA) as a polymerization initiator, 60.25 parts by mass of 2-ethylhexyl acrylate, 20 parts by mass of n-butyl acrylate, 12 parts by mass of methyl methacrylate, 3 parts by mass of 2-hydroxyethyl methacrylate, 2 parts by mass of methacrylic acid, 1 part by mass of acrylamide, 1 part by mass of polytetramethylene glycol diacrylate (manufactured by Nippon Oil & Fats Co., Ltd., trade name: ADT-250), and 0.75 parts by mass of a compound obtained by introducing a polymerizable 1-propenyl group into the benzene ring of an ammonium salt of sulfate of polyoxyethylene nonyl phenyl ether (average number of moles of ethylene oxide added: approximately 20) (manufactured by DKS Co., Ltd., trade name: AQUALON HS-10) as a water-soluble comonomer were charged, and subjected to emulsion polymerization under stirring at a temperature of 70 to 72° C. for 8 hours to afford acrylic resin emulsion P2.

Acrylic resin emulsion P2 obtained was neutralized (pH=7.0) with 9 wt % aqueous ammonia, and 0.8 parts by mass of CHEMITITE Pz-33 (2,2-bis(hydroxymethyl)butanol tris[3-(1-aziridinyl)propionate]) manufactured by NIPPON SHOKUBAI CO., LTD. with respect to 100 parts by mass of the polymer in terms of the solid content was further added thereto to afford adhesive coating solution 3 having a solid content of 42.5 wt %.

(Preparation of Adhesive Coating Solution 4)

Adhesive coating solution 4 was obtained in the same manner as for adhesive coating solution 1 except that the isocyanate crosslinking agent OLESTER P49-75S (manufactured by Mitsui Chemicals, Inc.) was replaced with the isocyanate crosslinking agent TAKENATE D-160N (manufactured by Mitsui Chemicals, Inc.).

(Preparation of Adhesive Coating Solution 5)

Adhesive coating solution 5 was obtained in the same manner as for adhesive coating solution 1 except that 0.5 parts by mass of the isocyanate crosslinking agent OLESTER P49-755 (manufactured by Mitsui Chemicals, Inc.) was replaced with 2 parts by mass of the isocyanate crosslinking agent TAKENATE D-170N (manufactured by Mitsui Chemicals, Inc.).

(Preparation of Adhesive Coating Solution 6)

Adhesive coating solution 6 was obtained in the same manner as for adhesive coating solution 1 except that the isocyanate crosslinking agent OLESTER P49-75S (manufactured by Mitsui Chemicals, Inc.) was replaced with the isocyanate crosslinking agent TAKENATE D-120N (manufactured by Mitsui Chemicals, Inc.).

(Preparation of Adhesive Coating Solution 7)

Synthesis of Acrylate-Based Polymer P3

Mixed were 21 parts by weight of 2-ethylhexyl acrylate, 48 parts by weight of ethyl acrylate, 21 parts by weight of methyl acrylate, 9 parts by weight of 2-hydroxyethyl acrylate, and 0.5 parts by weight of benzoyl peroxide as a polymerization initiator. The resultant was added dropwise into a nitrogen-purged flask containing 55 parts by weight of toluene and 50 parts by weight of ethyl acetate with stirring at 80° C. over 5 hours, and further reacted with stirring for 5 hours to afford a solution of acrylate-based polymer P3.

The weight-average molecular weight (Mw) of acrylate-based polymer P3 obtained was measured by using a GPC (Shodex System-21H manufactured by Showa Denko K.K.) to be Mw=325,000.

To the solution of acrylate-based polymer P3 obtained, the solution of acrylate-based polymer P1 was added so as to reach a solid content ratio of 90:10 in parts by weight, and the resultant was homogeneously stirred. Further, 0.2 parts by weight of the isocyanate crosslinking agent TAKENATE D-120N (manufactured by Mitsui Chemicals, Inc.) with respect to 100 parts by mass of the polymer mixture in terms of the solid content was added thereto, and the resultant was diluted with a 1:1 ethyl acetate/toluene mixed solvent to afford adhesive coating solution 7 having a solid content concentration of 27 mass %.

(Preparation of Adhesive Coating Solution 8)

To adhesive coating solution 5, 0.8 parts by mass of PERTETRA A (2,2-bis(4,4-bis(t-butylperoxy)cyclohexyl) propane) manufactured by NOF CORPORATION with respect to 100 parts by mass of the polymer in terms of the solid content was added to afford adhesive coating solution 8.

(Preparation of Adhesive Coating Solution 9)

To adhesive coating solution 7, 0.3 parts by mass of PERTETRA A (2,2-bis(4,4-bis(t-butylperoxy)cyclohexyl) propane) manufactured by NOF CORPORATION with respect to 100 parts by mass of the polymer in terms of the solid content was added to afford adhesive coating solution 9.

(Preparation of Adhesive Coating Solution 10)

To the solution of acrylate-based polymer P3. the solution of acrylate-based polymer P1 was added so as to reach a solid content ratio of 50:50 in parts by weight, and the resultant was homogeneously stirred. Further, 2 parts by weight of the isocyanate crosslinking agent TAKENATE D-170N (manufactured by Mitsui Chemicals, Inc.) with respect to 100 parts by mass of the polymer mixture in terms of the solid content was added thereto. Furthermore, 0.8 parts by mass of PERTETRA A (2,2-bis(4,4-bis(t-butylperoxy)cyclohexyl)propane) manufactured by NOF CORPORATION with respect to 100 parts by mass of the polymer in terms of the solid content was added thereto. The resulting solution was diluted with a 1:1 ethyl acetate/toluene mixed solvent to afford adhesive coating solution 10 having a solid content concentration of 27 mass %.

(Preparation of Adhesive Coating Solution 11)

To the solution of acrylate-based polymer P3, 0.8 parts by weight of the isocyanate crosslinking agent OLESTER P49-75S (manufactured by Mitsui Chemicals, Inc.) with respect to 100 parts by mass of the polymer mixture in terms of the solid content was added, and the resultant was diluted with a 1:1 ethyl acetate/toluene mixed solvent to afford adhesive coating solution 11 having a solid content concentration of 27 mass %.

Samples B1. B4. B6. B7. B9. and B11 for adhesive absorption layer B and samples C 1. C2. C3. C5. C8. and C10 for adhesive surface layer C were produced as described below, and the storage elastic modulus of each sample was measured.

A PET film one surface of which had been subjected to silicone treatment (release treatment) was prepared as a peeling film. Each of the adhesive coating solutions obtained was applied onto the release-treated surface of the PET film by using a die coater, and then dried at 100° C. for 5 minutes to form a coating film having a thickness of 50 μm. The coating film was further heated at 60° C. for 48 hours.

A plurality of the thus-obtained coating films was sequentially stacked to obtain sheets having a thickness of approximately 1 mm. These sheets were each cut into a disk having a diameter of approximately 8 mm and a thickness of about 1 mm, which were used as samples B1, B4. B6. B7. B9. and B11 for adhesive absorption layer B and samples C1, C2. C3. C5. C8. and C10 for adhesive surface layer C.

(Measurement of Storage Elastic Modulus)

The storage elastic modulus of each of the samples obtained was measured for the temperature range of −40 to 300° C. by using a dynamic viscoelastometer (manufactured by Rheometrics, Inc., model: RMS-800. with an attachment of parallel plates (parallel disks) having a diameter of 8 mm) at a frequency of 1 rad/sec. Specifically, each sample was set in the dynamic viscoelastometer via the attachment of parallel plates at 60° C., and the storage elastic modulus was measured while the temperature was raised at a rate of 3° C./min from −40 to 250° C. After the completion of the measurement, the data in the range of 25° C. or higher and 250° C. or lower were extracted from the storage elastic modulus-temperature curve obtained for −40 to 250° C., and, from the extracted data, the storage elastic modulus at a temperature at which the storage elastic modulus was minimized, G'bmin, i.e., the storage elastic modulus at 105° C. (B1), 100° C. (B4), 102° C. (B6), 118° C. (B7), 114° C. (B9), or 250° C. (B11), and the storage elastic modulus at 250° C., G'b250. were read for each sample.

The storage elastic modulus, G'cmin, and the storage elastic modulus at 250° C., G'c250. were read in the same manner for each of samples C1, C2. C3. C5. C8. and C10 for adhesive surface layer C.

TABLE 1

| | Material of adhesive absorption layer B | | | | | |
| --- | --- | --- | --- | --- | --- | --- |
| | B1 | B4 | B6 | B7 | B9 | B11 |
| Raw material | Coating solution 1 | Coating solution 4 | Coating solution 6 | Coating solution 7 | Coating solution 9 | Coating solution 11 |
| Minimum storage elastic modulus G'bmin [MPa] | 0.059 | 0.061 | 0.072 | 0.0095 | 0.027 | 0.021 |
| Temperature at which minimum storage elastic modulus is exhibited Tmin [° C.] | 105 | 100 | 102 | 118 | 114 | 250 |
| Storage elastic modulus at 250° C. G'b250 [MPa] | 3.0 | 3.1 | 2.9 | 0.015 | 0.2 | 0.021 |
| G'b250/G'bmin | 51 | 51 | 40 | 2 | 7 | 1 |

TABLE 2

| | Material of adhesive surface layer C | | | | | |
|---|---|---|---|---|---|---|
| | C1 | C2 | C3 | C5 | C8 | C10 |
| Raw material | Coating solution 1 | Coating solution 2 | Coating solution 3 | Coating solution 5 | Coating solution 8 | Coating solution 10 |
| Minimum storage elastic modulus G'cmin [MPa] | 0.80 | 0.85 | 0.20 | 0.092 | 0.059 | 0.15 |
| Storage elastic modulus at 250° C. G'c250 [MPa] | 0.92 | 0.93 | 0.20 | 0.88 | 3.0 | 0.9 |

2. Preparation of Film

Example 1

Production of Adhesive Absorption Layer B

A plasma-treated polyimide film (Kapton 150EN-A manufactured by DU PONT-TORAY CO., LTD., thickness: 38 μm) was prepared as substrate layer A. Adhesive coating solution 1 obtained was applied onto the plasma-treated portion of the polyimide film by using a die coater, and then dried at 100° C. for 5 minutes to form adhesive absorption layer B having a thickness of 50 μm.

Production of Adhesive Surface Layer C

Adhesive coating solution 1 obtained was separately applied onto a release-treated polyethylene terephthalate release film (SP-PET T15. manufactured by Mitsui Chemicals Tohcello, Inc.) by using a die coater, and then dried at 100° C. for 5 minutes to form a coating film having a thickness of 10 μm. Subsequently, the coating film obtained was thermally cured at 60° C. for 3 days to obtain adhesive surface layer C.

Production of Surface Protection Film

Adhesive surface layer C provided on the release film was attached on adhesive absorption layer B provided on the polyimide film, and pressed to transfer. Thus, a surface protection film consisting of three layers of substrate layer A/adhesive absorption layer B/adhesive surface layer C (38 μm/50 μm/10 μm) was obtained.

Example 2

A surface protection film was obtained in the same manner as in Example 1 except that the thickness of adhesive surface layer C was changed to 6 μm.

Example 3

A surface protection film was obtained in the same manner as in Example 1 except that the thickness of adhesive absorption layer B was changed to 75 μm.

Examples 4 and 5

A surface protection film was obtained in the same manner as in Example 1 except that the type of the adhesive coating solution to constitute adhesive surface layer C was changed as shown in Table 3. Curing was not performed in Example 5.

Examples 6 and 7

A surface protection film was obtained in the same manner as in Example 1 except that the type of the adhesive coating solution to constitute adhesive absorption layer B, and the type of the adhesive coating solution to constitute adhesive surface layer C and curing conditions therefor were changed as shown in Table 3.

Example 8

A surface protection film was obtained in the same manner as in Example 7 except that the type of substrate layer A was changed as shown in Table 3.

Examples 9 to 11. and Comparative Example 2

A surface protection film was obtained in the same manner as in Example 1 except that the type of adhesive absorption layer B, and the type of adhesive surface layer C and curing conditions therefor were changed as shown in Table 4.

Comparative Example 1

A surface protection film was obtained in the same manner as in Example 1 except that adhesive absorption layer B was not provided.

Each of the surface protection films obtained was affixed to the circuit forming surface of a semiconductor wafer as described below, and ground and then heated and peeled off In the course of the operations, evaluations of 1) affixability, 2) heat-resistant temperature under reduced pressure, 3) peelability, and 4) stain resistance were performed by using the following methods.

1) Affixability
1-1) Adhesion

Each of the surface protection films obtained was affixed to the surfaces of 10 silicon wafers each including an integrated circuit for practical evaluation incorporated up to the periphery portion of the wafer (diameter: 200 mm, thickness: 725 μm, chip area: 100 mm$^2$, width of scribe line: 100 μm, depth of scribe line: 2 μm, each chip partially provided with an insulating layer having a height of 10 μm) at 70° C. The condition between the surface protection film and the wafer was observed from the upper side of the surface protection film affixed by using the optical microscope OPTIPHOT2 (manufactured by Nikon Corporation), and the presence or absence of a bubble having a width of 100 μm or larger was determined. A case that even one wafer among the 10 wafers had a bubble having a diameter of 50 μm or larger was rated as "with a bubble".

1-2) Intrusion of Grinding Water

The back of the wafer including the surface protection film affixed thereto was ground by using the grinding apparatus DFG841 (manufactured by DISCO Corporation) while water was poured for cooling until the thickness of the wafer ground reached 60 μm. Grinding was performed for 10 wafers. After the completion of the grinding, the presence or absence of the intrusion of the grinding water into the interspace between the surface of each wafer and the surface protection film from the periphery of the wafer was checked by visual observation, and the number of wafers including the grinding water having intruded to a portion 5 mm or more inside from the edge was counted.

2) Vacuum Resistance (Heat-Resistant Temperature Under Reduced Pressure)

The surface protection film affixed to the circuit forming surface of each of the wafers in 1) was left to stand for 1 hour or longer, and then pre-baked at 150° C. for 15 minutes, and further heated at 150° C., 180° C., 200° C., 220° C., or 250° C. under reduced pressure of 100 Pa or lower for 30 minutes. The presence or absence of lifting of the film in the course of the heating under reduced pressure was determined by visual observation. The maximum temperature among temperatures in the range of 150° C. to 250° C. at which lifting was not found for any of the 10 wafers was defined as "heat-resistant temperature under reduced pressure". A case that a lifting having a diameter of 0.5 mm or larger was visually found was defined as "presence" of lifting.

3) Peelability
3-1) Adhesion Force

The surface protection films obtained were each affixed to a SUS304-BA sheet (in accordance with JIS G-4305. height: 20 cm, width: 5 cm) via the adhesive layer at 23° C., and left to stand for 1 hour. After leaving to stand, the surface protection film was heated from the substrate layer A side at 250° C. under reduced pressure ($10^{-3}$ Pa) by using a vacuum dryer for 30 minutes. Thereafter, one end of the surface protection film was held, and the film was peeled off from the surface of the SUS304-BA sheet at a peeling angle of 180° and a peeling speed of 300 mm/min. The stress in this peeling was measured, and converted to g/25 mm, which was used as the adhesion force. The other conditions were all in accordance with JIS Z-0237.

3-2) Cracks in Wafer

After observation for the intrusion of the grinding water in 1-2), each wafer was heated at $10^{-3}$ Pa and 250° C. by using a vacuum thermostatic dryer (VO-320 manufactured by ADVANTEC CO., LTD.) for 30 minutes. Subsequently, the surface protection film was peeled off by using a surface protection film remover (manufactured by Takatori Corporation, model: ATRM-2000B, peeling tape used: Highland Filament Tape No. 897 (manufactured by Sumitomo 3M Limited)). The number of wafers which broke in peeling off the surface protection film was counted.

4) Stain Resistance

The surface of a wafer which did not break in peeling in 3-3) was observed at a magnification of 50 to 1,000×, and all the chips on the surface of the wafer were checked for the presence or absence of a stain in a chip-by-chip manner. If one or more stains were visually found on the chips, whether the stains were due to grinding chips or due to adhesive residues was determined, and the stain generation rate, Cr, was calculated from the following equation.

$$Cr=(C2/C1)\times 100$$

(Cr: stain generation rate (%), C1: number of chips observed, C2: number of chips with a stain)

TABLE 3

| | | | Example 1 | Example 2 | Example 3 | Example 4 | Example 5 |
|---|---|---|---|---|---|---|---|
| Configuration of film | Substrate layer A | Type | polyimide | | | | |
| | | Trade name | Kapton (R)150EN-A | | | | |
| | | Thickness (μm) | 38 | | | | |
| | Adhesive absorption layer B | Coating solution | 1 | | | | |
| | | Base polymer | (meth)acrylate-based polymer P1 | | | | |
| | | Initial crosslinking agent/quantity of addition [part by mass] | OLESTER P49-75S/0.8 | | | | |
| | | Polymerization initiator Type/quantity of addition [part by mass] | PERTETRA A/0.8 | | | | |
| | | 10-hour half-life temperature (° C.) | 94.7 | | | | |
| | | Thickness (μm) | 50 | 50 | 75 | 50 | 50 |
| | Adhesive surface layer C | Coating solution | 1 | | | 2 | 3 |
| | | Base polymer | (meth)acrylate-based polymer P1 | | | | Emulsion-based acrylate polymer P2 |
| | | Initial crosslinking agent/quantity of addition [part by mass] | OLESTER P49-75S/0.8 | | | OLESTER P49-75S/0.8 | CHEMITITE Pz-33/0.8 |
| | | Polymerization initiator Type/quantity of addition [part by mass] | PERTETRA A/0.8 | | | PERBUTYL O/0.8 | — |
| | | 10-hour half-life temperature | 94.7 | | | 72.1 | — |
| | | Curing conditions | curing by heating at 60° C. for 3 days | | | curing by heating at 80° C. for 1 day | — |
| | | Thickness (μm) | 10 | 6 | 10 | 10 | 10 |
| Evaluation | Affixability | Adhesion | No bubble | No bubble | No bubble | No bubble | No bubble |
| | | Intrusion of grinding water | 0 | 0 | 0 | 0 | 0 |
| | Vacuum resistance | Heat-resistant temperature under reduced pressure (° C.) | 200 | 200 | 200 | 200 | 150 |
| | Peelability | Adhesion force after heating (N/25 mm) | 3.0 | 2.4 | 3 | 1.4 | 2.3 |
| | | Cracks in wafer in peeling | 0 | 0 | 0 | 0 | 0 |
| | Staining | Stain generation rate Cr (%) | 0 | 0 | 0 | 0 | 0 |
| | | Adhesive residue | Absence | Absence | Absence | Absence | Absence |

| | | | Example 6 | Example 7 | Example 8 |
|---|---|---|---|---|---|

TABLE 3-continued

| | | | | | |
|---|---|---|---|---|---|
| Configuration of film | Substrate layer A | Type | polyimide | | polyethylene naphthalate |
| | | Trade name | Kapton (R)150EN-A | | Teonex |
| | | Thickness (μm) | 38 | | 50 |
| | Adhesive absorption layer B | Coating solution | 4 | 6 | 6 |
| | | Base polymer | (meth)acrylate-based polymer P1 | | |
| | | Initial crosslinking agent/quantity of addition [part by mass] | TAKENATE D-160N/0.8 | TAKENATE D-120N/0.8 | |
| | | Polymerization initiator Type/quantity of addition [part by mass] | | PERTETRA A/0.8 | |
| | | 10-hour half-life temperature (° C.) | | 94.7 | |
| | Adhesive surface layer C | Thickness (μm) | 50 | 50 | 50 |
| | | Coating solution | | 5 | |
| | | Base polymer | (meth)acrylate-based polymer P1 | | |
| | | Initial crosslinking agent/quantity of addition [part by mass] | TAKENATE D-170N/2 | | |
| | | Polymerization initiator Type/quantity of addition [part by mass] | — | | |
| | | 10-hour half-life temperature | — | | |
| | | Curing conditions | curing by heating at 60° C. for 1 day | | |
| | | Thickness (μm) | 10 | 10 | 10 |
| Evaluation | Affixability | Adhesion | No bubble | No bubble | No bubble |
| | | Intrusion of grinding water | 0 | 0 | 0 |
| | Vacuum resistance | Heat-resistant temperature under reduced pressure (° C.) | 200 | 200 | 200 |
| | Peelability | Adhesion force after heating (N/25 mm) | 5.4 | 6.6 | 6.9 |
| | | Cracks in wafer in peeling | 0 | 0 | 0 |
| | Staining | Stain generation rate Cr (%) | 0 | 0 | 0 |
| | | Adhesive residue | Absence | Absence | Absence |

TABLE 4

| | | | Example 9 | Example 10 | Example 11 |
|---|---|---|---|---|---|
| Configuration of film | Substrate layer A | Type | polyimide | polyimide | polyimide |
| | | Trade name | Kapton 150EN-A | Kapton 150EN-A | Kapton 150EN-A |
| | | Thickness (μm) | 38 | 38 | 38 |
| | Adhesive absorption layer B | Coating solution | 7 | | 9 |
| | | Base polymer | (meth)acrylate-based polymer P1/P3 10/90 | | (meth)acrylate-based polymer P1/P3 10/90 |
| | | Initial crosslinking agent/quantity of addition [part by mass] | TAKENATE D-120N/0.8 | | TAKENATE D-120N/0.8 |
| | | Polymerization initiator Type/quantity of addition [part by mass] | — | — | PERTETRA A/0.3 |
| | | 10-hour half-life temperature (° C.) | — | — | 94.7 |
| | Adhesive surface layer C | Thickness (μm) | 50 | 200 | 50 |
| | | Coating solution | 5 | 8 | 10 |
| | | Base polymer | (meth)acrylate-based polymer P1 | | (meth)acrylate-based polymer P1/P3 50/50 |
| | | Initial crosslinking agent/quantity of addition [part by mass] | TAKENATE D-170N/2 | | TAKENATE D-170N/2 |
| | | Polymerization initiator Type/quantity of addition [part by mass] | — | PERTETRA A/0.8 | PERTETRA A/0.8 |
| | | 10-hour half-life temperature (° C.) | — | 94.7 | 94.7 |
| | | Curing conditions | Curing by heating at 60° C. for 1 day | Curing by heating at 60° C. for 1 day | Curing by heating at 60° C. for 1 day |
| | | Thickness (μm) | 10 | 20 | 20 |
| Evaluation | Affixability | Adhesion | No bubble | No bubble | No bubble |
| | | Intrusion of grinding water | 0 | 0 | 0 |
| | Vacuum resistance | Heat-resistant temperature under reduced pressure (° C.) | 250 or higher | 250 or higher | 250 or higher |
| | Peelability | Adhesion force after heating (N/25 mm) | 8.5 | 8.6 | 10.6 |
| | | Cracks in wafer in peeling | 0 | 0 | 0 |

TABLE 4-continued

| | | | | | |
|---|---|---|---|---|---|
| Staining | Stain generation rate Cr (%) | | 0 | 0 | 0 |
| | Adhesive residue | | Absence | Absence | Absence |

| | | | Comparative Example 1 | Comparative Example 2 |
|---|---|---|---|---|
| Configuration of film | Substrate layer A | Type | polyimide | polyimide |
| | | Trade name | Kapton 150EN-A | Kapton 150EN-A |
| | | Thickness (μm) | 38 | 38 |
| | Adhesive absorption layer B | Coating solution | — | 11 |
| | | Base polymer | — | (meth)acrylate-based polymer P3 |
| | | Initial crosslinking agent/quantity of addition [part by mass] | — | OLESTER P49-75S/0.8 |
| | | Polymerization initiator Type/quantity of addition [part by mass] | — | — |
| | | 10-hour half-life temperature (° C.) | — | — |
| | | Thickness (μm) | — | 50 |
| | Adhesive surface layer C | Coating solution | 1 | 3 |
| | | Base polymer | (meth)acrylate-based polymer P1 | emulsion-based acrylate polymer P2 |
| | | Initial crosslinking agent/quantity of addition [part by mass] | OLESTER P49-75S/0.8 | CHEMITITE Pz-33 |
| | | Polymerization initiator Type/quantity of addition [part by mass] | PERTETRA A/0.8 | — |
| | | 10-hour half-life temperature (° C.) | 94.7 | — |
| | | Curing conditions | Curing by heating at 100° C. for 1 day | — |
| | | Thickness (μm) | 10 | 10 |
| Evaluation | Affixability | Adhesion | With a bubble | No bubble |
| | | Intrusion of grinding water | 9 | 0 |
| | Vacuum resistance | Heat-resistant temperature under reduced pressure (° C.) | 150 or lower | 150 or lower |
| | Peelability | Adhesion force after heating (N/25 mm) | 0.3 | 18 |
| | | Cracks in wafer in peeling | 0 | 0 |
| | Staining | Stain generation rate Cr (%) | 0 | 0 |
| | | Adhesive residue | Absence | Presence |

As shown in Table 3 and Table 4. it can be seen that each of the films in Examples 1 to 11 did not undergo lifting in heating, and thus had satisfactory affixability. This is probably because G'bmin of adhesive absorption layer B was lower than 0.1 MPa for each of the films in Examples 1 to 11. and the film satisfactorily conformed with the irregularities in the wafer. In addition, each of the films in Examples 1 to 11 had satisfactory peelability without leaving an adhesive residue after heating. This is probably because G'cmin of adhesive surface layer C was 0.03 MPa or higher and the temperature at which G'bmin is exhibited of adhesive absorption layer B was 50 to 150° C. for each of the films in Examples 1 to 11. and hence adhesive residues and cracks in the wafer due to the increase of the adhesion force in peeling were prevented.

In contrast, it can be seen that the film in Comparative Example 1 had insufficient affixability. This is probably because the film in Comparative Example 1 did not include adhesive absorption layer B, and hence could not conform sufficiently with the irregularities in the circuit forming surface of the semiconductor wafer.

In the case of the film in Comparative Example 2. the adhesion force after heating was high, and adhesive residues were generated to cause peeling failure. This is probably because the adhesion force after heating was excessively high from the result that the temperature at which G'bmin is exhibited of adhesive absorption layer B was higher than 150° C. and the storage elastic modulus of adhesive absorption layer B decreased in the high-temperature process.

The present application claims the priority based on Japanese Patent Application No. 2015-134596 filed on Jul. 3, 2015. The contents of the specification and the drawing are incorporated herein.

INDUSTRIAL APPLICABILITY

The present invention can provide a semiconductor wafer surface protection film which can be affixed to the circuit forming surface of a semiconductor wafer to conform satisfactorily with irregularities in the circuit forming surface of the semiconductor wafer and prevent cracks or adhesive residues in the wafer in peeling even after a high-temperature process such as the back metal process.

The invention claimed is:

1. A semiconductor wafer surface protection film comprising a substrate layer A, an adhesive absorption layer B, and an adhesive surface layer C in the order presented, wherein
the adhesive absorption layer B comprises an adhesive composition comprising a thermoset resin b1,
a minimum value, G'bmin, of a storage elastic modulus, G'b, in a range of 25° C. or higher and lower than 250° C. of the adhesive absorption layer B is 0.001 MPa or higher and lower than 0.1 MPa, the storage elastic modulus at 250° C., G'b250, of the adhesive absorption layer B is 0.005 MPa or higher and 10 MPa or lower, and the temperature at which the G'bmin is exhibited is 50° C. or higher and 150° C. or lower, and a minimum value, G'cmin, of a storage elastic modulus, G'c, in a range of 25° C. or higher and lower than 250° C. of the adhesive surface layer C is 0.03 MPa or higher and lower than 3 MPa.

2. The semiconductor wafer surface protection film according to claim 1, wherein the G'cmin is higher than the G'bmin.

3. The semiconductor wafer surface protection film according to claim 1, wherein the G'b250 is higher than the G'bmin.

4. The semiconductor wafer surface protection film according to claim 1, wherein
the storage elastic modulus at 250° C., G'c250, of the adhesive surface layer C is 0.1 MPa or higher and 100 MPa or lower.

5. The semiconductor wafer surface protection film according to claim 1, wherein the thickness of the adhesive absorption layer B, Tb, is 10μm or larger and 600μm or smaller, and the thickness of the adhesive surface layer C, Tc, is 1μm or larger and 50 μm or smaller.

6. The semiconductor wafer surface protection film according to claim 1, wherein the thermoset resin b1 is a thermoset resin having a thermopolymerizable double bond, an epoxy group, or an aziridinyl group.

7. The semiconductor wafer surface protection film according to claim 1, wherein the thermoset resin b1 is a (meth)acrylate-based polymer having a thermopolymerizable double bond, an epoxy group, or an aziridinyl group.

8. The semiconductor wafer surface protection film according to claim 1, wherein the thermoset resin b1 is a (meth)acrylate-based polymer having a thermopolymerizable double bond.

9. The semiconductor wafer surface protection film according to claim 7, wherein constitutional units each modified with a compound having the thermopolymerizable double bond, the epoxy group, or the aziridinyl group account for 0.2 to 30 mol % of all constitutional units of the (meth)acrylate-based polymer.

10. The semiconductor wafer surface protection film according to claim 1, wherein the adhesive composition further comprises a thermal polymerization initiator.

11. The semiconductor wafer surface protection film according to claim 1, wherein
the adhesive composition further comprises a thermoplastic resin b2, and
the content ratio between the thermoset resin b1 and the thermoplastic resin b2 is 1/99 to 90/10 as b1/b2 in a mass ratio.

12. The semiconductor wafer surface protection film according to claim 11, wherein the thermoplastic resin b2 is a (meth)acrylate-based polymer.

13. The semiconductor wafer surface protection film according to claim 1, wherein the adhesive composition further comprises a crosslinking agent.

14. The semiconductor wafer surface protection film according to claim 1, wherein the adhesive surface layer C comprises a (meth)acrylate-based polymer.

15. The semiconductor wafer surface protection film according to claim 14, wherein the (meth)acrylate-based polymer contained in the adhesive surface layer C has a thermopolymerizable double bond, an epoxy group, or an aziridinyl group.

16. The semiconductor wafer surface protection film according to claim 15, wherein at least a part of the (meth)acrylate-based polymer having a thermopolymerizable double bond, an epoxy group, or an aziridinyl group contained in the adhesive surface layer C has been cured.

17. A method for producing a semiconductor apparatus, the method comprising:
affixing the semiconductor wafer surface protection film according to claim 1 to a circuit forming surface of a semiconductor wafer at a temperature lower than the temperature at which G'bmin is exhibited;
grinding a non-circuit forming surface of the semiconductor wafer having the semiconductor wafer surface protection film affixed thereto;
processing the non-circuit forming surface of the semiconductor wafer after grinding at a temperature equal to or higher than the temperature at which G'bmin is exhibited; and
peeling off the semiconductor wafer surface protection film.

18. The method for producing a semiconductor apparatus according to claim 17, wherein a step having a height of 0.1 μm or larger has been provided on the circuit forming surface of the semiconductor wafer.

19. The method for producing a semiconductor apparatus according to claim 17, wherein the processing at a temperature equal to or higher than the temperature at which the G'bmin is exhibited includes: forming a thin film on the non-circuit forming surface of the semiconductor wafer by at least one selected from the group consisting of sputtering, vapor deposition, plating, and chemical vapor deposition; impurity-activating annealing; ion-injecting; or reflowing.

* * * * *